(12) United States Patent
Wark et al.

(10) Patent No.: US 7,928,579 B2
(45) Date of Patent: Apr. 19, 2011

(54) DEVICES INCLUDING SLOPED VIAS IN A SUBSTRATE AND DEVICES INCLUDING SPRING-LIKE DEFLECTING CONTACTS

(75) Inventors: James M. Wark, Boise, ID (US); Syed S. Ahmad, Fargo, ND (US)

(73) Assignee: Micron Technology, Inc., Boise, ID (US)

( * ) Notice: Subject to any disclaimer, the term of this patent is extended or adjusted under 35 U.S.C. 154(b) by 767 days.

(21) Appl. No.: 11/588,977

(22) Filed: Oct. 27, 2006

(65) Prior Publication Data

US 2007/0045857 A1    Mar. 1, 2007

Related U.S. Application Data

(62) Division of application No. 10/933,847, filed on Sep. 2, 2004, now Pat. No. 7,390,740.

(51) Int. Cl.
*H01L 23/02* (2006.01)
*H01L 23/34* (2006.01)
*H01L 23/48* (2006.01)

(52) U.S. Cl. .......... 257/774; 257/686; 257/723; 257/777
(58) Field of Classification Search .................. None
See application file for complete search history.

(56) References Cited

U.S. PATENT DOCUMENTS

| 4,814,041 A | 3/1989 | Auda |
| 4,830,706 A | 5/1989 | Horwath et al. |
| 4,964,212 A | 10/1990 | Deroux-Dauphin et al. |
| 5,269,880 A | 12/1993 | Jolly et al. |
| 5,445,988 A | 8/1995 | Schwalke |
| 5,496,755 A | 3/1996 | Bayraktaroglu |
| 5,585,675 A | 12/1996 | Knopf |
| 5,848,685 A | 12/1998 | Smith et al. |
| 5,851,894 A | 12/1998 | Ramm |
| 5,985,521 A | 11/1999 | Hirano et al. |

(Continued)

FOREIGN PATENT DOCUMENTS

JP    04298076 A    10/1992

OTHER PUBLICATIONS

Linder et al., Nanosprings—New Dimensions in Sputtering, Advanced Packaging, pp. 44-47, Jul. 2002.

*Primary Examiner* — Zandra Smith
*Assistant Examiner* — Pamela E Perkins
(74) *Attorney, Agent, or Firm* — TraskBritt

(57) ABSTRACT

Methods for forming vias are disclosed. The methods include providing a substrate having a first surface and an opposing, second surface. The vias are formed within the substrate to have a longitudinal axis sloped at an angle with respect to a reference line extending perpendicular to the first surface and the second surface of the substrate. The vias may be formed from the first surface to the opposing second surface, or the via may be formed as a first blind opening from the first surface, then a second opening may be formed from the second surface to be aligned with the first opening. Vias may be formed completely through a first substrate and a second substrate, and the substrates may be bonded together. Semiconductor devices including the vias of the present invention are also disclosed. A method of forming spring-like contacts is also disclosed.

30 Claims, 9 Drawing Sheets

U.S. PATENT DOCUMENTS

| | | |
|---|---|---|
| 6,143,649 A | 11/2000 | Tang |
| 6,306,682 B1 | 10/2001 | Huang et al. |
| 6,486,055 B1 | 11/2002 | Kim |
| 6,716,737 B2 | 4/2004 | Plas et al. |
| 6,759,270 B2 | 7/2004 | Infantolino et al. |
| 6,809,539 B2 * | 10/2004 | Wada et al. .................. 324/762 |
| 6,812,576 B1 | 11/2004 | Fazelpour et al. |
| 2002/0006718 A1 | 1/2002 | Distefano |
| 2002/0170891 A1 | 11/2002 | Boyle et al. |
| 2002/0170897 A1 | 11/2002 | Boyle at al. |
| 2005/0003602 A1 | 1/2005 | Lowrey et al. |

* cited by examiner

DEVICES INCLUDING SLOPED VIAS IN A SUBSTRATE AND DEVICES INCLUDING SPRING-LIKE DEFLECTING CONTACTS

CROSS-REFERENCE TO RELATED APPLICATION

This application is a divisional of application Ser. No. 10/933,847, filed Sep. 2, 2004, now U.S. Pat. No. 7,390,740, issued Jun. 24, 2008.

BACKGROUND OF THE INVENTION

1. Field of the Invention

The present invention relates generally to the field of semiconductor device fabrication and, more particularly, to interposers and semiconductor die substrates including slanted or sloped vias formed therethrough and methods for their fabrication. The present invention additionally relates to spring-like deflecting contacts and methods for their fabrication.

2. State of the Art

In order to function, integrated circuits such as semiconductor dice must be in electrical communication with signal inputs and outputs as well as power and ground or bias connections external to the integrated circuit. For example, power and ground or other reference voltage must be supplied for operation of the integrated circuit, and other connections, such as for input, output and timing signals, may also be required. These connections are conventionally made through leads or other conductive elements connected to bond pads present on the active surface of a semiconductor die. However, an inner lead bond (ILB) pattern on the active surface of a semiconductor die may include contacts in the form of bond pads which are very small, i.e., 100 microns square, very closely spaced or pitched (typically along or adjacent a center line of the die or along a periphery of the die) and, as a result, are difficult to align with and electrically contact because of their relatively small size.

To electrically connect to the small contacts in the ILB pattern, the contacts in the form of bond pads of the ILB pattern may be redistributed to other locations on the active surface using a redistribution layer (RDL). The RDL comprises a plurality of conductive traces extending from the bond pads of the ILB pattern to redistribute the contact locations of the ILB pattern to another I/O terminal layout, such as an outer lead bond (OLB) pattern that includes terminal pads, which are more widely pitched and, thus, easier to electrically contact.

Where present, the traces of an RDL may be embedded into a dielectric material. Suitable dielectric materials may include benzocyclobutene (BCB), polyimide, and photosensitive dielectrics. The process steps depend on whether the redistribution traces are aluminum or copper. For aluminum traces, the aluminum is sputtered onto the wafer surface and the traces are etched using a photolithography-defined etch mask pattern comprising a resist. In the case of copper traces, the metal is electroplated onto the wafer surface and then selectively etched to form traces. An RDL may conventionally be applied on the active surface of a semiconductor die to enable flip-chip mounting of the resulting "chip-scale" package on a carrier substrate such as an interposer or a printed circuit board. However, the formation of the RDL traces and redistributed contact pads requires at least one extra step in the fabrication process of a semiconductor die and adds time and expense to the fabrication process.

Another method of providing external electrical contacts to integrated circuitry of a semiconductor die is to form vias, or through-holes, extending between the active surface and the back side of the semiconductor die (typically while the die is at the wafer level and in conjunction with the formation of vias in all of the semiconductor dice of the wafer or other bulk substrate) and to fill the vias with a conductive material. However, one problem of conventionally providing vias through semiconductor dice from an ILB pattern is that the size and pitch of the bond pads have been continually decreasing while the total number of bond pads on a single semiconductor die has been continually increasing due to ongoing advances in semiconductor fabrication and increased circuit complexity. For example, a chip scale package can include a hundred or more external contacts, each having a lateral extent of about 10 mils and a pitch of about 30 mils. While it is possible to reroute the ILB pattern on the active surface of a semiconductor die and then form vias through the semiconductor die substrate from redistributed contact locations to the back side thereof, such an approach is self-defeating as still requiring an RDL extending to the via locations. Further, there may not be sufficient space, or "real estate," on the active surface to provide sufficient redistributed locations for vias, which are also sometimes known as "through wafer interconnects," or "TWIs."

A technique for reducing the real estate required on a carrier substrate is the use of stacked semiconductor chips in a single package. In stacked chip-scale packages, two or more semiconductor chips will be mounted in a stack and electrically interconnected to a carrier substrate and/or to one another. This reduces the space taken on the underlying carrier substrate in comparison to mounting separate chips directly to the substrate.

Stacked chip-scale packages may require vias to be formed through the entire thickness of a semiconductor die between the active surface and backside thereof, allowing electrical connection therethrough to one or more dice stacked thereon. Conventionally, such vias are filled with conductive material to interconnect electrical devices and metallization at various levels.

Electrical contact structures are an integral part of connecting semiconductor devices to external electrical components, such as other semiconductor devices, printed circuit boards, probe cards, etc. There are several conventional bonding methods known in the art for electrically connecting semiconductor devices to another electrical device. Some of these methods include wire bonding, tab bonding, solder-bump bonding, and flip-chip bonding, among many other methods.

Another example of electrical contacts is described in U.S. Pat. No. 5,848,685 to Smith et al. ("the Smith Patent") entitled "Photolithographically Patterned Spring Contact," the disclosure of which is incorporated by reference herein and the article "Nanosprings—New Dimensions in Sputtering" available on the worldwide web at semiconductors.unaxis-.com/en/p44_47_nanosprings.pdf. The above documents disclose photolithographically patterned spring contacts that may be used for flip-chip contacts or for probe card applications. FIG. 12 is a side view of such a spring contact. Bonding structure 100 includes a plurality of spring contacts 34. Each spring contact 34 comprises a free, cantilevered portion 42 and an anchor portion 46 fixed to an insulating underlayer 48 made from silicon nitride or other etchable insulating material and electrically connected to a contact pad 50. Each spring contact 34 is made of an extremely elastic material, such as a chrome-molybdenum alloy or a nickel-zirconium alloy. The contact pad 50 is the terminal end of a line or trace that electrically communicates between an electronic device formed on the substrate 44 or device 101 such as a transistor, a display electrode, or other electrical device. However, while the patterned spring contacts of the Smith Patent may be used to create an array of spring contacts connectable to an external device, the method of forming them requires a series of complex steps.

Accordingly, a need exists for a via that efficiently facilitates connection between the fine pitch bond pads of an ILB pattern and external electrical devices, and a spring contact that is easy to manufacture.

BRIEF SUMMARY OF THE INVENTION

The present invention, in a number of exemplary embodiments, includes sloped vias within a substrate, as well as a method of forming sloped vias. The sloped vias are formed within the substrate to have a longitudinal axis sloped at an angle with respect to a reference line extending perpendicular to a surface of the substrate. Spring-like deflecting contacts may be formed using the sloped vias. The sloped vias may be formed in semiconductor wafers, interposer substrates, or other semiconductor component structures.

In one aspect of the present invention, a plurality of vias may extend from the first surface of the substrate to the second surface of the substrate in a fan pattern. The access points of the plurality of vias on the first surface of the substrate have a finer pitch, or spacing, than the access points on the second surface of the substrate. The plurality of vias may be filled with conductive material to form conductive paths between the first surface of the substrate and the second surface of the substrate.

A method according to the present invention of forming the plurality of vias includes laser drilling from the first surface of the substrate completely through to the second surface of the substrate. Alternatively, the vias may be formed first as openings extending partially through the substrate from either the first or the second surface of the substrate. Openings may then be formed from the opposing surface of the substrate to form vias extending completely therethrough.

In another aspect of the present invention, multiple substrates may be provided, and a plurality of sloped vias formed through each substrate at complementary angles. The substrates may be bonded together, forming a single, multi-layer substrate having vias extending completely therethrough.

In a third aspect of the present invention, each via of a plurality of vias extending through a substrate may include a portion angled with respect to the first surface of the substrate, and a portion perpendicular with respect to the first surface of the substrate. The plurality of vias may be formed, according to the present invention, as angled openings extending partially through the substrate from either the first or the second surface of the substrate. Openings perpendicular to the first surface of the substrate may then be formed from the opposing surface of the substrate, to an associated angled opening, resulting in vias extending completely therethrough. Vias including an angled portion and a perpendicular portion may alternatively be formed according to the present invention using multiple substrates to form a multi-layer substrate.

The plurality of vias of the present invention may be formed in a larger scale on, for example, a wafer. The plurality of vias may be positioned in a plurality of via patterns. One method according to the present invention of forming the plurality of vias includes forming each of the vias positioned at a first angle with respect to the substrate, then forming each of the vias positioned at a second angle with respect to the substrate, and so on until each of the plurality of via patterns is complete.

In another aspect of the present invention, a stacked semiconductor assembly includes a sloped via. The sloped via may electrically connect two laterally offset bond pads of different semiconductor devices. An RDL trace may provide electrical communication to a third bond pad. The sloped via may extend through multiple semiconductor devices.

In yet another aspect of the present invention, an electrical device, such as a contact card or an interposer, employing a plurality of spring-like deflecting contacts is disclosed. A substrate may have a plurality of spring like deflecting electrical contacts, each comprising a conductive path. The conductive paths each have a free, cantilevered portion extending from a surface of the substrate at an angle, and another portion fixed within the substrate at the same angle.

A method of forming the spring-like deflecting contacts according to the present invention includes forming a sloped via within a substrate. The sloped via may be filled with conductive material to form a conductive path. The substrate may be etched to provide a free, cantilevered portion of the conductive path extending from a surface of the substrate at an angle.

A plurality of sloped vias of the present invention may be formed in a fan pattern, each of the sloped vias located in the same plane, for example the x-z plane. For example, the access points of the plurality of vias on the first surface of the substrate may be arranged in a linear pattern, and the access points of the plurality of vias on the second, opposing surface of the substrate may be arranged in a linear pattern having wider spacing. Alternatively, a plurality of sloped vias may each be located in separate planes. The plurality of sloped vias may form a fan pattern in the x and y direction through a substrate. For example, the access points of the plurality of vias on the first surface of the substrate may be arranged in a linear pattern, and the access points of the plurality of vias on the second, opposing surface of the substrate may be arranged in a two-dimensional array.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
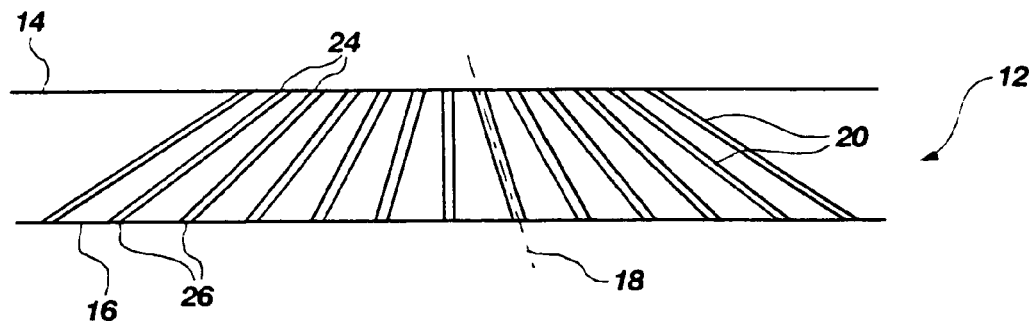
FIG. 1 is a cross-section of a semiconductor substrate having vias of the present invention.

The present invention provides methods for forming sloped vias extending at an angle between one surface and an opposing surface of a semiconductor substrate, as well as semiconductor substrates having sloped vias created by those methods. The sloped vias of the present invention may be used in semiconductor components, stacked semiconductor component configurations, and assemblies resulting therefrom. The inventive methods of forming the sloped vias include forming a plurality of vias in a fan-in or fan-out pattern. The present invention has utility in forming electrical connections between semiconductor devices and in redistributing I/Os to change the pitch of a single semiconductor die. The present invention additionally has utility in forming spring-like deflecting contacts.

The term "substrate" used in the following description refers to any generally planar supporting structure including, but not limited to, semiconductor wafers, interposer substrates or other semiconductor component structures. The term should be understood to include silicon, silicon-on-insulator (SOI), silicon-on-sapphire (SOS), doped and undoped semiconductors, epitaxial layers of silicon supported by a base semiconductor foundation, and other semiconductor structures. The substrate need not be silicon-based or even a semiconductor. The substrate may be silicon-germanium, germanium, gallium arsenide, indium phosphide, ceramic, plastic or glass filled resin material (e.g., FR-4). When reference is made to a "substrate" in the following description, previous process steps may have been utilized to form active regions or junctions in or on the semiconductor substrate.

Referring to the accompanying drawings used to illustrate the exemplary embodiments, the drawings and various elements depicted in the drawings are not drawn to scale, but are illustrative. It will be apparent by those of ordinary skill in the art that while the methods and structures disclosed herein describe methods for fabricating vias and semiconductor components resulting therefrom, the acts and structures described herein comprise a portion of an entire fabrication process of a semiconductor device or other substrate and may be used in combination with other semiconductor fabrication methods.

FIG. 1 depicts a cross section of a semiconductor substrate 12 with an exemplary plurality of vias 20 formed therethrough. The semiconductor substrate 12 has a first surface 14 and an opposing second surface 16. As shown, the vias 20 pass substantially entirely through the semiconductor substrate 12, from first surface 14 to the opposing second surface 16. It will be appreciated that vias 20, which do not pass entirely through the substrate 12 but merely penetrate to a selected depth therein, may be created and used in methods in accordance with the present invention. For example, the via 20 may terminate at a bond pad (not shown) on the first surface 14 or on the second surface 16, as discussed hereinafter. Each via 20 as depicted includes a first surface access point 24 and a second surface access point 26. Each via 20 may be angled with respect to the substrate first surface 14 and second surface 16, such that each first surface access point 24 of a via 20 may be laterally offset from the associated second surface access point 26 of the via 20. The plurality of first surface access points 24 defines an access point pattern on the first surface 14, and the plurality of second surface access points 26 defines an access point pattern on the second surface.

In this exemplary embodiment, the vias 20 each have a longitudinal axis 18 and may be formed in the substrate 12 by, for example, laser drilling, plasma etching or machining. Once the vias 20 are created, they may be filled with conductive material. The longitudinal axis 18 may define a center point of each via 20. The longitudinal axis 18 of each via 20 is angled differently than at least some other vias 20 with respect to the first surface 14, defining a fan pattern in the substrate 12. In other words, the pitch, or spacing, of the access point pattern of the first surface is smaller than the pitch of the access point pattern of the second surface. The access point pattern of the first surface may be a mirror image of the ILB pattern of a semiconductor die for electrical connection thereto. The access point pattern of the second surface may be arranged to contact pads on another semiconductor component such as another die, interposer or other carrier substrate. Thus, the contact locations of the ILB pattern may be redistributed to another I/O terminal layout.

A representative dimension, or diameter, of each via 20 may be from about 10 µm to about 2 mils or greater. The cross-section of each via 20 transverse to the longitudinal axis 18 may be of a circular shape, but it will be appreciated by those of ordinary skill in the art that the cross-sectional shape of each via 20 may be any other known shape for forming through-vias including, without limitation, rectangular, square, trapezoidal, oval, tear-drop and any combinations thereof.

Laser drilling, or ablation, may be effected using equipment, such as the Model 5000-series lasers, offered currently by ElectroScientific Industries of Portland, Oreg. One specific, suitable piece of equipment is a 355 nm wavelength UV YAG laser, Model 2700, which may be used to form vias 20. Another suitable laser system is the Xise 200, offered by Xsil Ltd. of Dublin, Ireland, which company also has a U.S. office in Loveland, Colo. The Xsil product may be used to form vias as small as about 10 µm to about 15 µm in diameter. The areas of the substrate 12 irradiated by the laser may reach a temperature of 1400° C. It is currently believed that above 600° C. damage occurs to active regions within a substrate. By using a plurality of short bursts from the laser, heat flow into the substrate 12 due to the thermal input from the laser is minimized during the forming of the vias 20 and deleterious effects, such as dopant redistribution within an adjacent active region does not occur. A 355 nm wavelength laser, as previously referenced, may be operated at a power of about 4 to 9 W, for example 5 W, and from about a 20 kHz to a 60 kHz cycle or repetition rate to form each via 20. If laser drilling is used to form the vias 20, a wet etchant, such as an HF based etch, may be used to remove the native oxide present on the semiconductor substrate 12 and any resultant oxide or nitride formed due to thermal oxidation or nitriding during the laser drilling process. The wet etch will also smooth and remove any debris resulting from the laser drilling process. The vias 20, having an angled longitudinal axis 18 oriented at an angle with respect to the first surface 14 of the semiconductor substrate 12, may be laser drilled by properly positioning the laser. In other words, the "working field" of the laser, being the semiconductor substrate 12, may remain fixed, and the laser adjusted and positioned to form each via 20.

In lieu of laser ablation or machining, each via 20 may be formed by any other suitable method of forming through-vias or openings in the substrate 12 that is appropriate for the type of material used to fabricate the substrate 12 including, without limitation, a dry etch process, mechanical drilling, or any combination thereof. Heat produced from a laser ablation or machining process used to form the vias 20 in substrate 12 may damage the surrounding semiconductor material, forming a so-called heat affected zone (HAZ), which is typically etched to clean the vias 20, using, for example, a 6% TMAH in propylene glycol solution. Where each via 20 is relatively large, the amount of heat generated by the laser beam becomes significant and may lead to damage to the integrated circuitry itself. Thus, the vias 20 may be formed with a dry etch (reactive ion etch, or RIE) process appropriate for the type of substrate 12 to avoid this problem.

Deep reactive ion etching (DRIE) is one technique of dry etching to form deep, high aspect ratio structures such as the vias 20. The so-called "Bosch" process of DRIE is accomplished in part by using both a passivation and an etch step. The semiconductor substrate 12 may be adjusted and positioned to form each via 20 at the desired angle.

Another nonlimiting example of a suitable technology for forming the vias 20 is the so-called atmospheric downstream plasma (ADP) process offered by Tru-Si Technologies, Inc. of Sunnyvale, Calif. As applied to via formation, the ADP process is implemented using an aluminum mask layer formed over a surface of a semiconductor substrate patterned with apertures to define via locations. An argon carrier gas is employed, with fluorine as the reactant gas. The etch effected is substantially isotropic. Where necessary, the vias 20 may be cleaned using any suitable process to provide a clean and porous surface at the sidewalls of vias 20.

The inner surfaces of the vias 20 may optionally include or be coated with a dielectric layer, also known as a passivation layer (not shown), depending on the type of material used for the substrate 12. The dielectric layer may comprise any known insulating material such as silicon oxide or silicon nitride deposited to any desired thickness using CVD or other known deposition process. The dielectric layer may also be grown on exposed surfaces of the substrate 12 using an oxidizing atmosphere such as steam and oxygen at an elevated temperature. The insulation layer may also comprise an insulating polymer, such as a polyimide, deposited using a suitable process such as a spin-on process or an injection or capillary process. The dielectric layer may provide a layer of separation between the inner surface of the vias and any conductive material forming a conductive path within the via, as described hereinbelow.

The vias 20 may be filled with one or more conductive materials to form a conductive path. At least three different methods of forming conductive paths may be used. In a first method, each via 20 is filled with conductive materials, such as conductive metals, in a plurality of layers. A physical vapor deposition (PVD, or sputtering) process or chemical vapor deposition (CVD) process, including metallic organic chemical vapor deposition (MOCVD) may be used to deposit the layers of conductive material. Aluminum, for example, may be sputtered as a first conductive layer. The use of aluminum is particularly desirable if an aluminum bond pad lies at the bottom of a via. The first conductive layer may be coated with a second conductive layer. The second conductive layer may be nickel or copper, each of which are particularly suitable if the cores of the vias are to be filled with a solder, as these two metals are highly wettable by most solders. The core of each via may comprise a solder paste or conductive particles in an organic carrier deposited in each via. A solder paste may be physically placed into the via, for example, by squeegeeing. The conductive particles may comprise silver nanoparticles in an organic carrier, which are available from vendors including Emulsitone of Whippany, N.J. and Superior Micropowders of Albuquerque, N. Mex. In either case, the substrate 12 may then be heated to reflow the solder or melt the silver nanoparticles, fill the vias, drive off any volatile organics and form conductive paths.

In other methods of forming conductive paths within the vias 20, the conductive material may be plugs of a single metal that completely fills the vias 20. Alternatively, the conductive paths may comprise one or more layers of conductive material that cover or line the inside surfaces or sidewalls of the openings, while the interiors of the vias 20 are filled with a nonconductive material. In such an instance, a conductive pad may then be formed over the end of the conductive via in communication with the conductive lining. In addition to the conductive metals listed with regard to filling each via 20 with conductive materials in a plurality of layers, other conductive metals that may be used to fill the vias 20 include, without limitation, titanium, iridium, gold, tungsten, silver, platinum, palladium, tantalum, molybdenum, tin, zinc, alloys of these metals including solder, and any combinations thereof.

In addition to using conductive metals to fill the vias 20, the conductive material may comprise a conductive or conductor-filled polymer. For instance, the conductive or conductor-filled polymer may be deposited in the through-holes as a viscous, flowable material and cured as required. Suitable deposition processes for conductive polymers include screen printing or stenciling. Other suitable conductive polymers may include a nano-particle paste or ink having metal nano-particles made of conductive metal, such as aluminum.

Once each via 20 is filled with conductive material to form a conductive path, the conductive path may extend from a contact or bond pad, such as an ILB pad, lying over at least a portion of the access point of each via 20. The bond pads would generally have been formed previously by a conventional process during fabrication of integrated circuitry on the substrate 12 of a semiconductor component if the component comprises a semiconductor die. In such an instance, the via would comprise a blind via terminating at the underside of the bond pad. If the semiconductor component is other than a semiconductor die, however, bond or terminal pads may be formed subsequent to the conductive filling of the via.

Figure 2A:
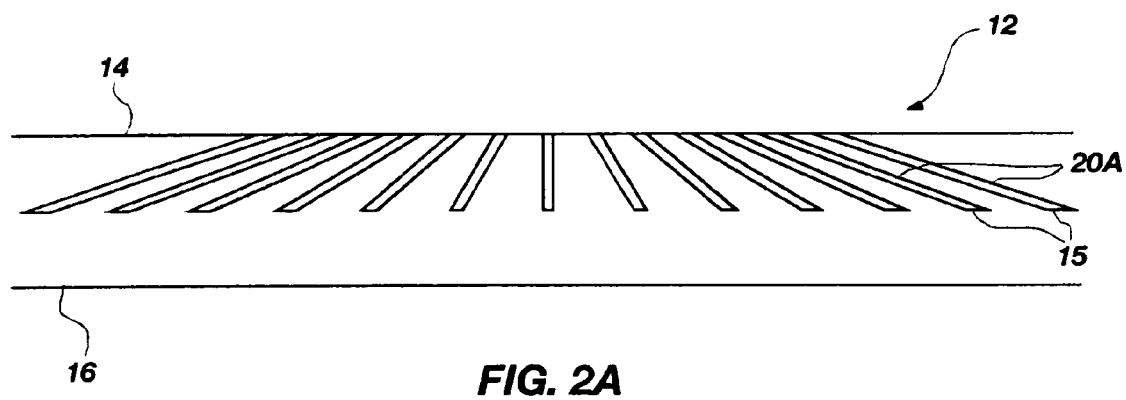
FIGS. 2A and 2B illustrate an exemplary method for forming vias of the present invention.
Figure 2B:
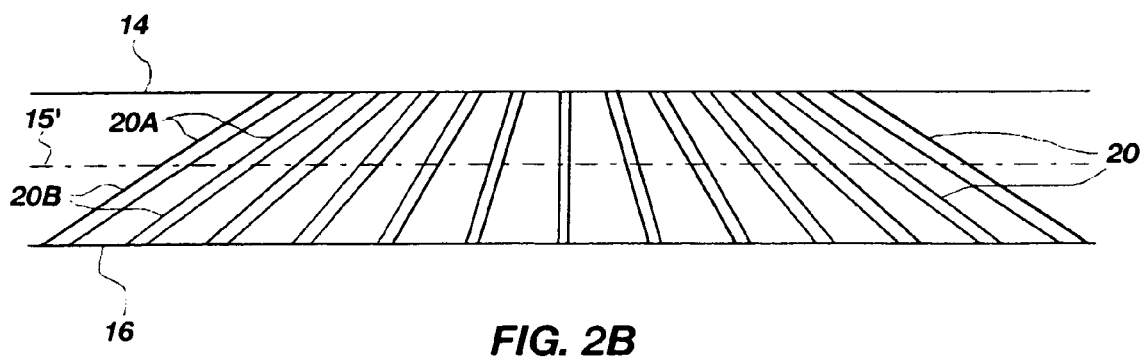

The following methods of forming the vias 20 in the semiconductor substrate 12 will be described with respect to laser drilling; however, as will be understood by one of ordinary skill in the art, any of the aforementioned methods of forming vias may be employed, or any other method of forming vias known in the art. Referring again to FIG. 1, the vias 20 may be formed in the substrate 12 by drilling from the first surface 14 to the second surface 16, or drilling from the second surface 16 to the first surface 14. In an alternative method, depicted in FIGS. 2A and 2B, a plurality of first openings 20A may be formed in the semiconductor substrate 12. The depth of the first opening 20A is such that each first opening 20A creates a blind via, i.e., the first opening 20A does not extend entirely through the substrate 12. A bottom surface 15 of the first opening 20A defines a lowermost portion of each first opening 20A. A plurality of second openings 20B is formed from the second surface 16 of the semiconductor substrate 12, each second opening 20B formed at substantially an angle equal to the angle of each associated first opening 20A. Each second opening 20B may be drilled from the second surface 16 and through the bottom surface 15 of the associated first opening 20A at a plane 15' to form the plurality of vias 20.

Figure 3A:
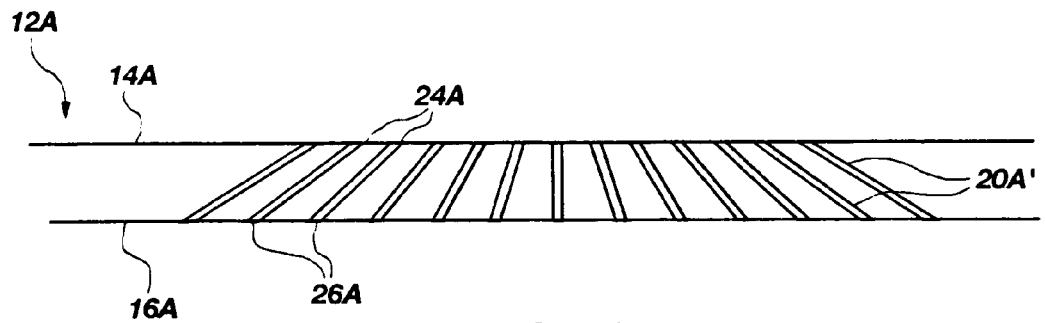
FIGS. 3A through 3C depict an exemplary embodiment of a method for forming vias of a second embodiment of the present invention.
Figure 3B:
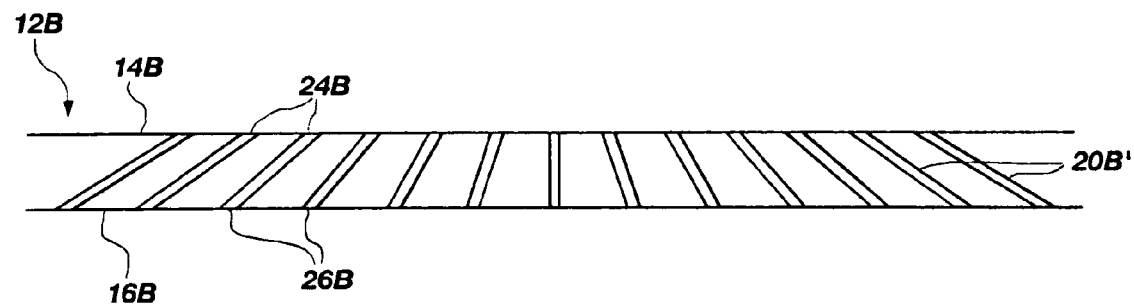
Figure 3C:
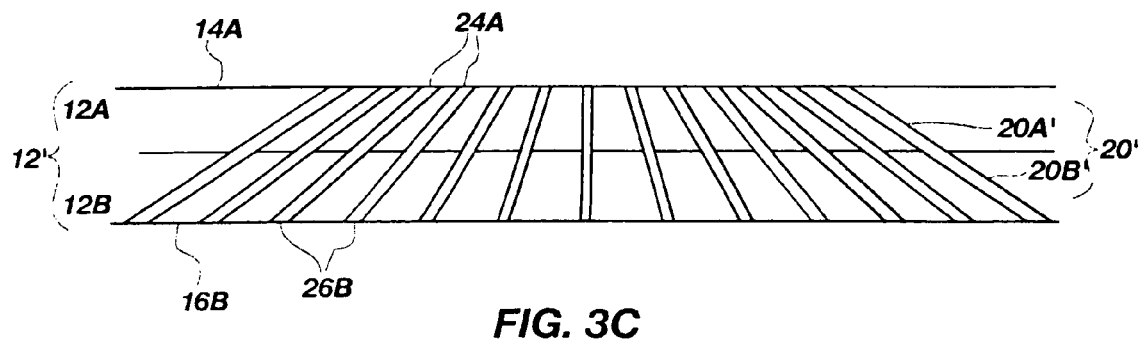

FIG. 3C illustrates a second embodiment of vias 20' in a semiconductor substrate 12' and FIGS. 3A through 3C show a method of forming the second embodiment of vias 20'. The semiconductor substrate 12' comprises a first semiconductor substrate 12A having a first surface 14A and an opposing second surface 16A. The first surface 14A of the first semiconductor substrate 12A has a plurality of first openings 20A' formed therein. Each first opening 20A' includes a first surface access point 24A and a second surface access point 26A. In this exemplary embodiment, the plurality of first openings 20A' defines a fan pattern in the first semiconductor substrate 12A. Each first opening 20A' may extend through the first surface 14A of the first semiconductor substrate 12A at the first surface access point 24A, or may terminate at an I/O terminal (not shown) on first surface 14A. Each first opening 20A' extends completely through the second surface 16A of the first semiconductor substrate 12A at the second surface access point 26A. The plurality of first openings 20A' may be formed by laser drilling or etching, as described hereinabove.

Turning next to FIG. 3B, a second semiconductor substrate 12B has a first surface 14B and an opposing second surface 16B. The first surface 14B of the second semiconductor substrate 12B has a plurality of second openings 20B' formed therein. Each second opening 20B' may be formed substantially at an angle equal to the angle of each associated first opening 20A'. Each second opening 20B' may extend through the second surface 16B, or may terminate at a bond pad (not shown) on the second surface 16B. Each second opening 20B' includes a first surface access point 24B and a second surface access point 26B. The spacing of the plurality of second opening 20B' first surface access points 24B may be a mirror image of the spacing of the plurality of first opening 20A' second surface access points 26A. The plurality of second openings 20B' may be formed by laser drilling or etching, as described hereinabove.

Referring next to FIG. 3C, the first semiconductor substrate 12A and the second semiconductor substrate 12B may be attached, with the second surface 16A of the first semiconductor substrate 12A contiguous with the first surface 14B of the second semiconductor substrate 12B, forming semiconductor substrate 12'. The second opening 20B' first surface access points 24B may be aligned with the plurality of first opening 20A' second surface access points 26A to forming a plurality of vias 20' through semiconductor substrate 12'.

Figure 4A:
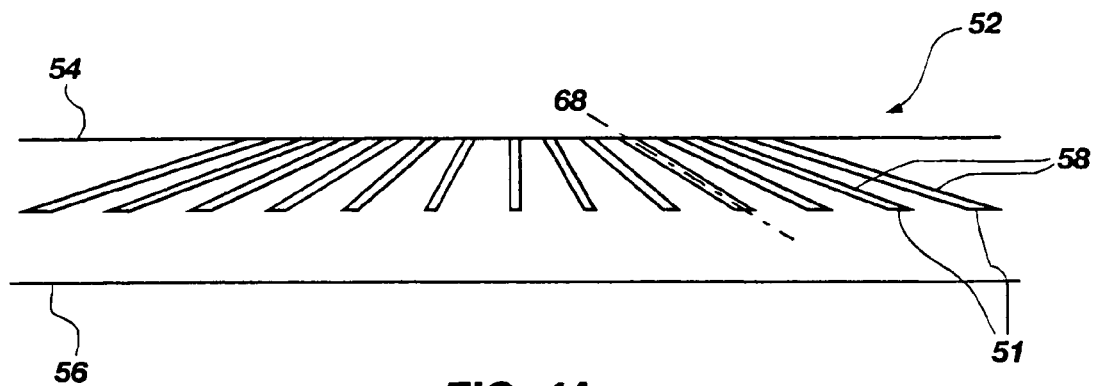
FIGS. 4A and 4B depict an exemplary embodiment of a method for forming vias of a third embodiment of the present invention.
Figure 4B:
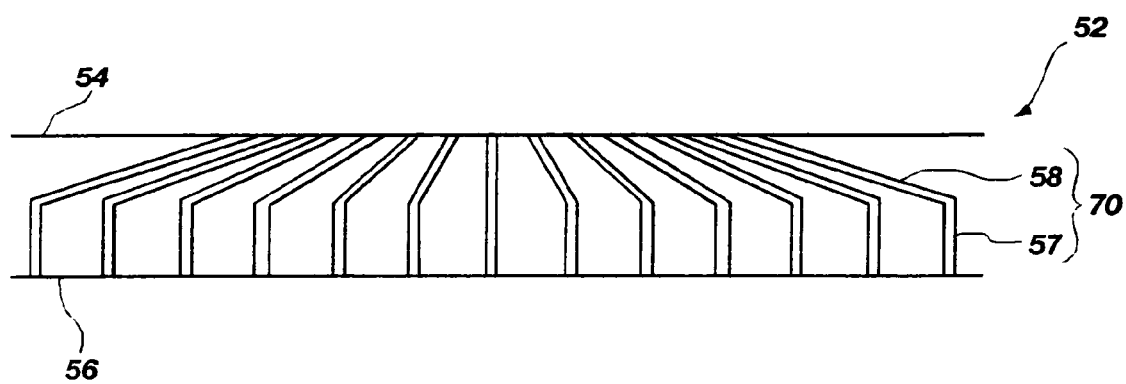

FIG. 4B illustrates a third embodiment of vias 70 in a semiconductor substrate 52, and FIGS. 4A and 4B show a method of forming the third embodiment of vias 70. The semiconductor substrate 52 has a first surface 54 and an opposing second surface 56. The first surface 54 of the substrate 52 has a plurality of first openings 58 formed therein. In this exemplary embodiment, each first opening 58 has a first longitudinal axis 68, and each first longitudinal axis 68 is angled differently with respect to the first surface 54. The plurality of first openings 58 thus defines a fan pattern in the substrate 52. The depth of the first opening 58 is such that the first opening 58 creates a blind via, i.e., the first opening 58 does not extend through the substrate 12. A bottom surface 51 of the first opening 58 defines a lowermost portion of each first opening 58. The first opening 58 extends through the first surface 54 of the substrate 52.

FIG. 4B illustrates the semiconductor substrate 52 of FIG. 4A with vias 70 including a plurality of second openings 57 formed therein. Each of the plurality of second openings 57, as shown, have substantially parallel longitudinal axes with respect to one another, although such a mutually parallel orientation is not required. Each second opening 57 extends through the substrate 52 from the second surface 56 through the bottom surface of each associated bottom surface 51 of the first openings 58. Each first opening 58 and second opening 57 together form each via 70. The second opening 57 extends through the second surface 56 of the substrate 52. The plurality of first openings 58 and the plurality of second openings 57 may be formed by laser drilling or etching, as described hereinabove.

Figure 5A:
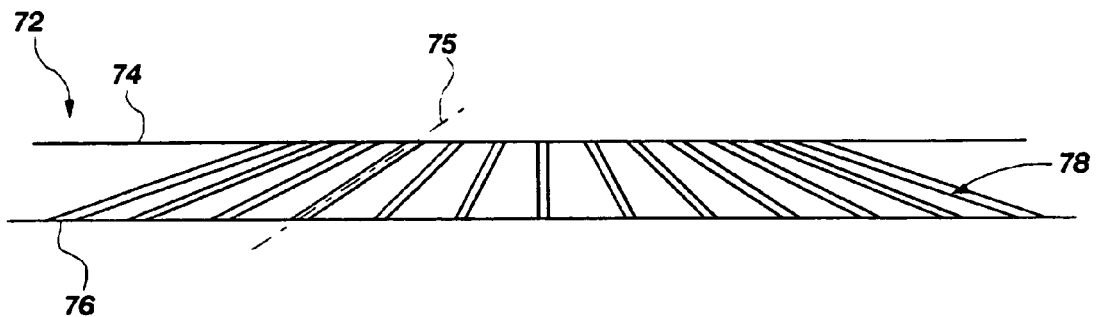
FIGS. 5A through 5C depict an exemplary embodiment of a method for forming vias of a fourth embodiment of the present invention.
Figure 5B:
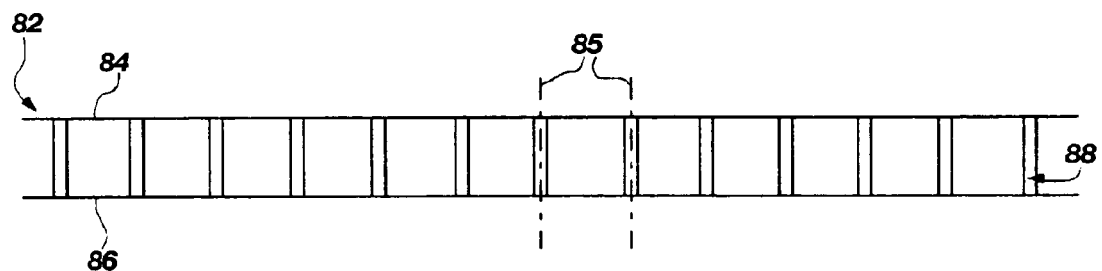
Figure 5C:
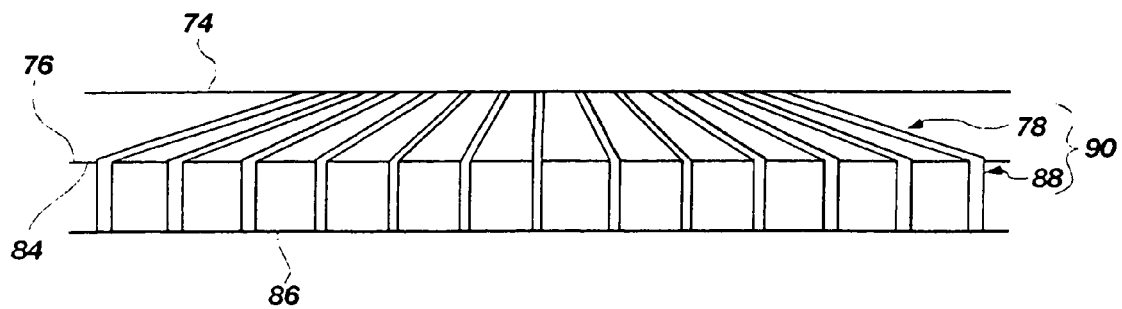

A fourth embodiment of a semiconductor substrate of the present invention, and a method of forming the semiconductor substrate is shown in FIGS. 5A through 5C. Turning first to FIG. 5A, a first semiconductor substrate 72 has a first surface 74 and an opposing second surface 76. The first surface 74 of the first semiconductor substrate 72 has a plurality of first openings 78 formed therein. In this exemplary embodiment, each first opening 78 has a first longitudinal axis 75, and each longitudinal axis 75 is angled differently with respect to the first surface 74, defining a fan pattern in the first semiconductor substrate 72. The first opening 78 may extend through the first surface 74 of the first semiconductor substrate 72, or may terminate at an I/O terminal (not shown) on first surface 74. The first opening 78 extends completely through the second surface 76 of the first semiconductor substrate 72.

Turning next to FIG. 5B, a second semiconductor substrate 82 has a first surface 84 and an opposing second surface 86. The first surface 84 of the second semiconductor substrate 82 has a plurality of second openings 88 formed therein. A longitudinal axis 85 of each second opening 88 may be substantially parallel to the other longitudinal axis 85, although such mutually parallel orientation is not required. The spacing of the plurality of second openings 88 may be a mirror image of the spacing of the plurality of first openings 78 at the second surface 76 of the first semiconductor substrate 72 (see FIG. 5A). The second opening 88 extends through the first surface 84 of the second semiconductor substrate 82. The second opening 88 may extend through the second surface 86, or may terminate at a bond pad (not shown) on second surface 86.

As shown in FIG. 5C, the first semiconductor substrate 72 and the second semiconductor substrate 82 may be attached, with the second surface 76 of the first semiconductor substrate 72 contiguous with the first surface 84 of the second semiconductor substrate 82. Each first opening 78 and associated second opening 88 together form a continuous via 90.

Figure 6:
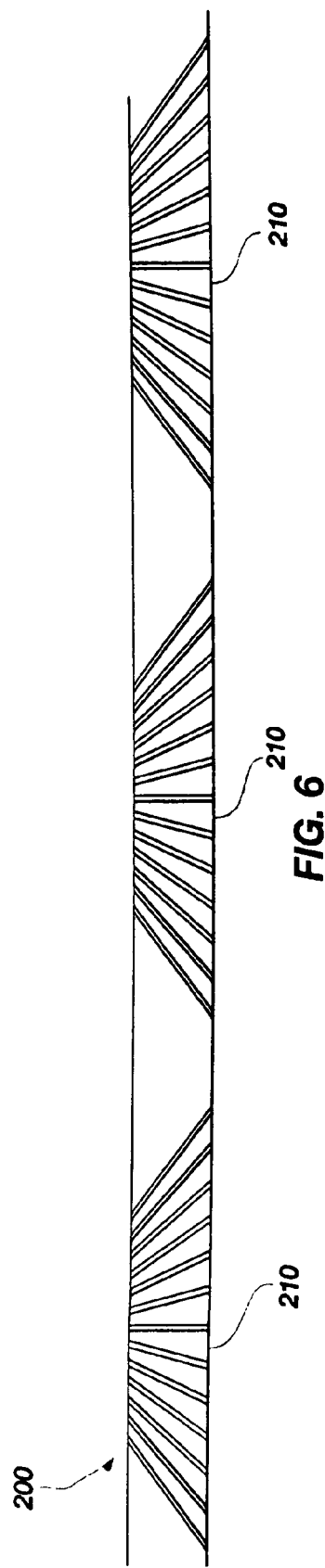
FIG. 6 illustrates a cross-section of a fifth embodiment of a semiconductor substrate including vias of the present invention.

As another alternative, vias may be formed in a semiconductor substrate on a larger scale, such as a wafer or other large-scale, or bulk, substrate. FIG. 6 shows a plurality of via patterns 210 on a wafer 200, and each via pattern 210 may be associated with integrated circuitry (not shown) of a semiconductor die. Each semiconductor die may be separate from one another or physically and electrically connected to one another on the large-scale substrate. The via pattern 210 of each semiconductor die may have the same configuration, or the wafer may include via patterns having many different configurations. By way of example and not limitation, a via pattern having a different configuration might be a via pattern comprising mutually parallel vias.

Figure 7A:
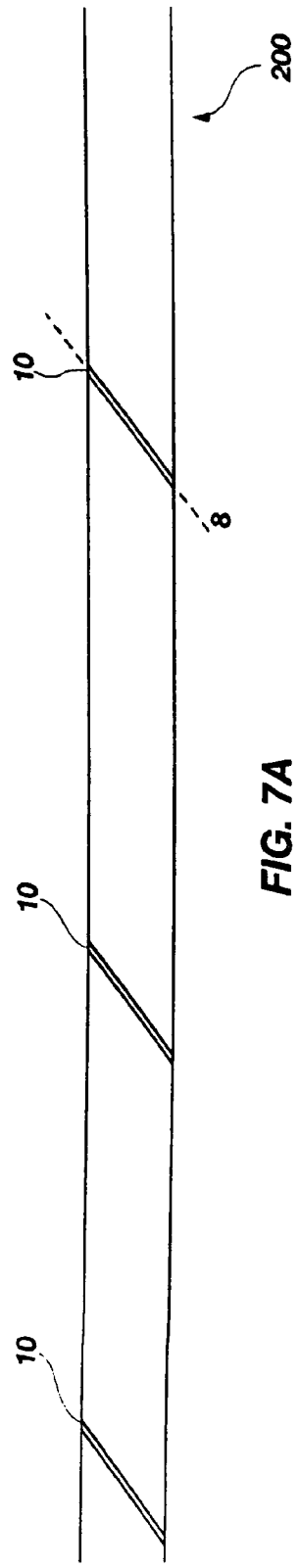
FIGS. 7A and 7B illustrate an exemplary method for forming the vias of the semiconductor substrate of FIG. 6.
Figure 7B:
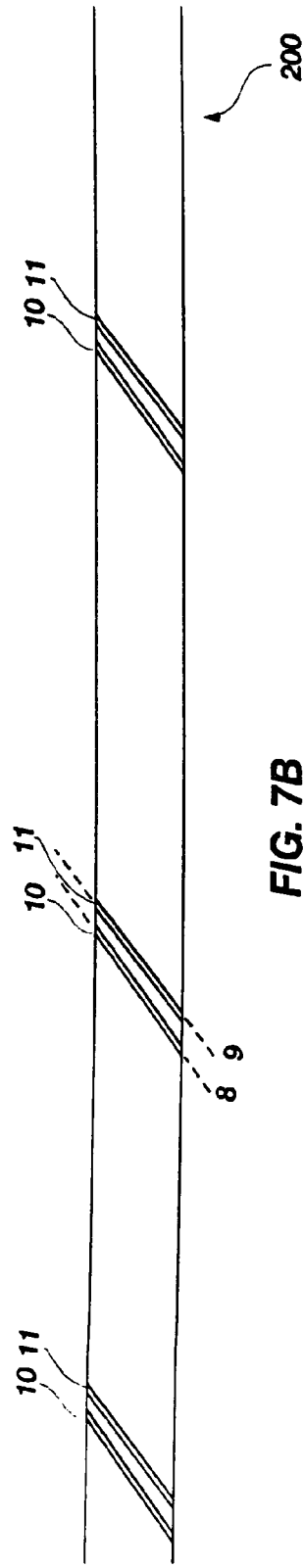

FIGS. 7A and 7B depict a method of forming the plurality of via patterns on the wafer 200. Each via 10 of each via pattern 210 having a longitudinal axis 8 of substantially the same angle is formed, as shown in FIG. 7A. Next, each via 11 of each via pattern having a longitudinal axis 9 of substantially another angle is formed. This process is repeated until the patterning of the entire wafer is completed. Forming each via having the longitudinal axis of substantially the same angle before forming each via having the longitudinal axis of substantially another angle allows minimal adjustments to the position and angle of the laser if the vias are formed by laser drilling. Concurrently forming vias having substantially the same longitudinal axes may be a desirable method of forming vias by etching because adjustments to the angle of the semiconductor substrate or wafer may be minimized.

Figure 8:
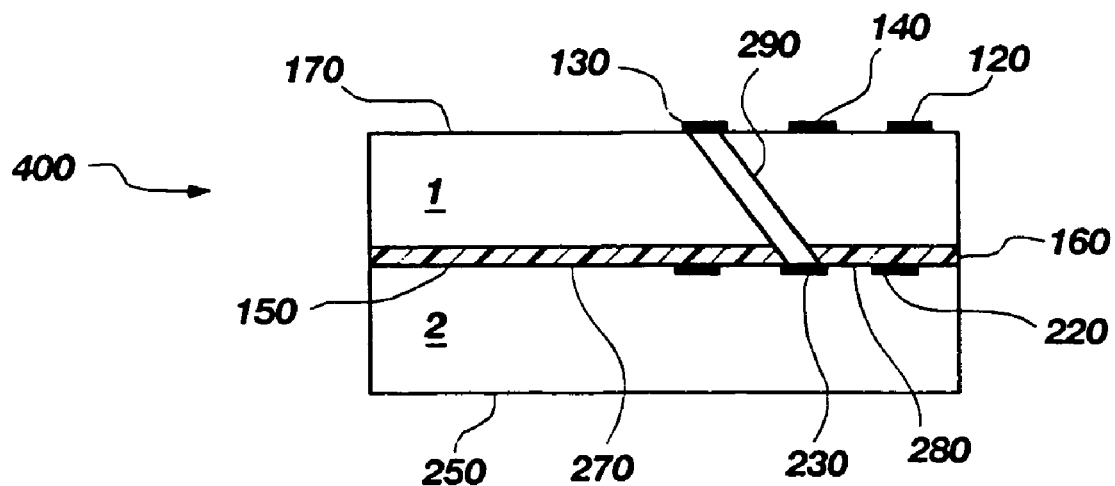
FIG. 8 illustrates a stacked semiconductor device assembly including vias of the present invention.

FIG. 8 shows a stacked semiconductor device assembly 400 A first substrate 1 is a semiconductor die including an active surface 170 bearing active circuitry and bond pads, or I/O terminals 120, 130 operably coupled to the active circuitry. A second substrate 2 is another semiconductor die including an active surface 270 bearing active circuitry and bond pads, or I/O terminals 220, 230 operably coupled to the active circuitry. Each substrate includes an opposing, second surface 150, 250. The first substrate 1 is stacked over the second substrate 2 with the opposing second surface 150 of the first substrate 1 adhered to the active surface 170 of the second substrate 2 with an adhesive 160. The adhesive 160 may comprise a thermoplastic resin, a thermoset resin, or an epoxy. The bond pads 120, 130 of the first substrate 1 and the bond pads 220, 230 of the second substrate 2 may be substantially aligned, that is, stacked over one another as shown, or may be separated, or unaligned as stacked. The first substrate 1 and the second substrate 2 may be substantially identical.

Identical semiconductor dice conventionally have corresponding address, power supply, and data lines that may be paralleled. As a result, like memory devices may be physically stacked upon one another with the bottom device mounted on a printed circuit board or other second level package. The I/O terminals of each device may be connected to each other through parallel, vertical vias. I/O terminals receiving signals that cannot be paralleled are not connected together, and must instead have separate I/O terminal locations. The bond pads 120, 220 may be "chip select" (CS) terminals. Generally, the CS terminal, which, when active, selects the memory device rank for reading and writing operations, is not paralleled with other device CS terminals. Because not all memory devices in a memory stack need to be activated at the same time, the CS terminals conventionally do not share signals with other CS terminals.

The bond pads 130, 230 may be unused bond pads. RDL trace 280 may connect the second substrate CS terminal 220 with the second substrate 2 unused bond pad 230. A via 290 may connect the second substrate 2 unused bond pad 230 with the first substrate 1 unused bond pad 130. The first substrate 1 unused bond pad 130 and the second substrate unused bond pad 230 are not aligned, and via 290 may be sloped to provide connection between the offset, unused bond pads 130, 230. Optionally, the use of RDL trace 280 may be avoided by connecting the second substrate CS terminal 220 with another first substrate unused bond pad 140 using a sloped via.

Figure 9:
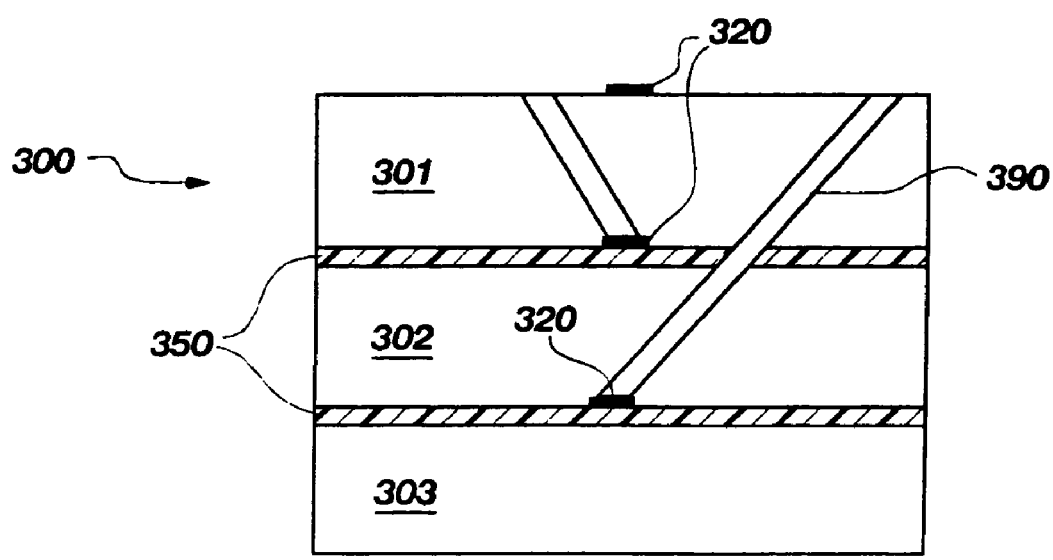
FIG. 9 illustrates another stacked semiconductor device assembly including vias of the present invention.

In another aspect of the present invention, as illustrated in FIG. 9, stacked semiconductor device assembly 300 may include more than two semiconductor substrates. The assembly 300 includes a first semiconductor substrate 301, a second semiconductor substrate 302, and a third semiconductor substrate 303. Adhesive layers 350 secure the semiconductor substrates 301, 302, and 303 in stacked formation. Each semiconductor substrate includes at least one bond pad 320. A via 390 may be formed through multiple semiconductor substrates, for example, a first semiconductor substrate 301 and a second semiconductor substrate 302, and connect to the bond pad 320 of a third semiconductor substrate 303. The via 390 may be sloped to avoid intersection with the bond pad 320 of the second semiconductor substrate 302. The via 390 may be positioned to avoid any additional circuitry on the second semiconductor substrate 302.

It will be appreciated that vias that do not pass substantially entirely through the substrate but merely penetrate to a selected depth therein may be created and used in methods in accordance with the present invention. It will be further appreciated that, although, for simplicity of understanding, only one via 290 is depicted in FIG. 8, and two vias 390 are depicted in FIG. 9, the methods of the present invention may be, and in most instances would be, simultaneously conducted with a large plurality of vias in a semiconductor substrate. A plurality including any number of vias may be formed. It will also be appreciated by those of ordinary skill in the art that the methods of the present invention will typically be applied on a wafer or other bulk semiconductor substrate scale for efficiency, although the invention is not so limited.

Figure 10A:
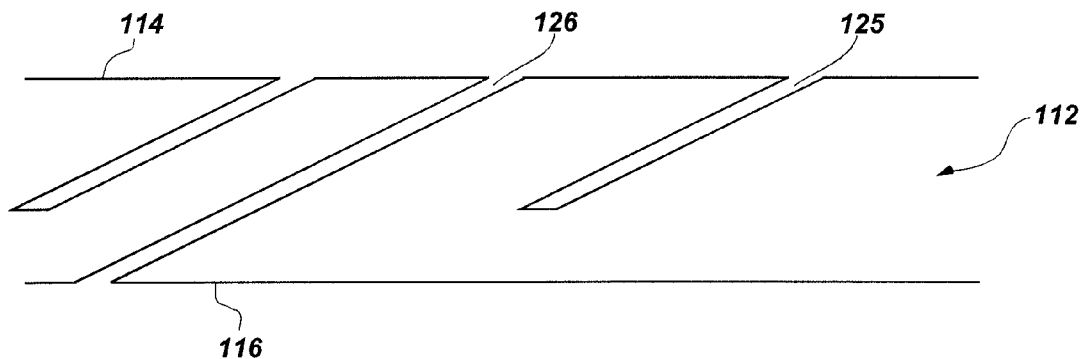
FIGS. 10A through 10C illustrate a method of forming spring-like deflecting contacts of the present invention.
Figure 10B:
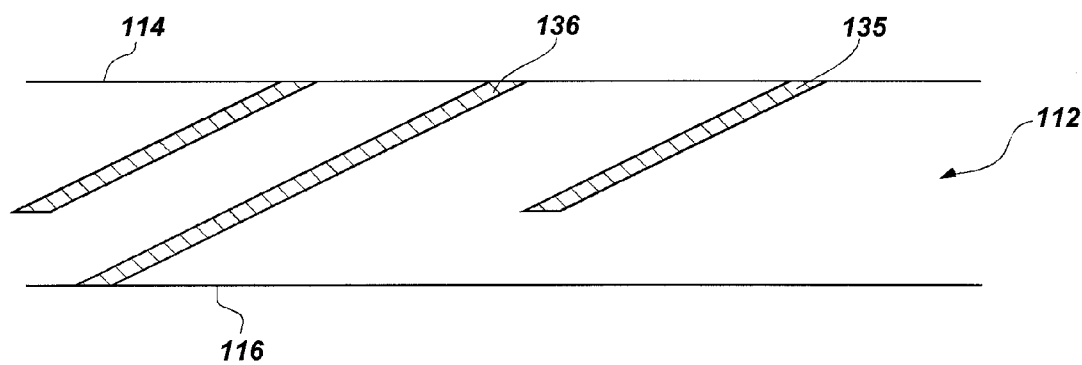
Figure 10C:
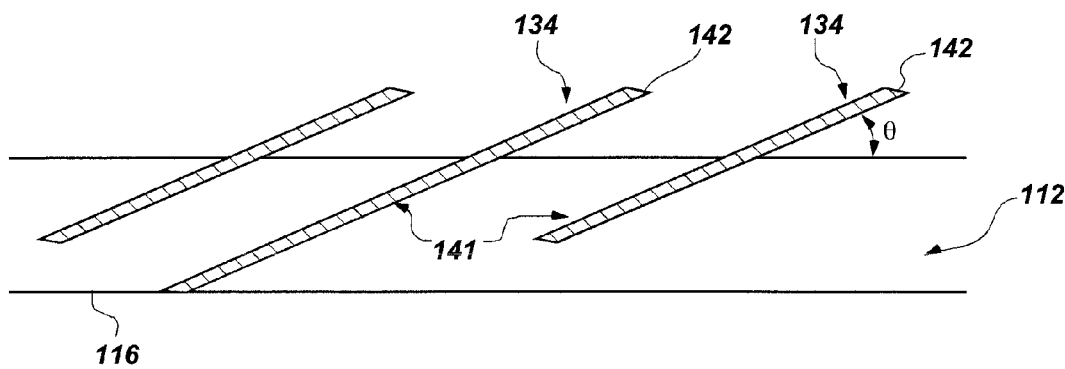

An exemplary embodiment for forming spring-like deflecting contacts 134, or pins, of the present invention is shown in FIGS. 10A through 10C. Referring to FIG. 10A, a substrate 112 is provided having a plurality of sloped vias 125, 126 formed therein. The sloped vias 125, 126 may be formed by laser drilling, or any other suitable method, as described hereinabove. The sloped via 125 may comprise a blind via, i.e., the sloped via 125 does not extend entirely through the substrate 112. Alternatively, the sloped via 126 may extend substantially through the semiconductor substrate 112 from a first surface 114 of the semiconductor substrate 112 to a second surface 116 of the semiconductor substrate 112.

As shown in FIG. 10B, each sloped via 125, 126 is filled with a conductive material to form a conductive path 135, 136, for example by plating, or any other suitable method, as described hereinabove. The conductive material may comprise, for example, aluminum, copper, or alloys thereof. In addition, any of the conductive metals listed hereinabove with regard to filling a via with conductive materials may be employed. The semiconductor substrate 112 may be subsequently etched to a selected depth 118, forming a free, cantilevered portion 142 of each conductive path 135, 136 as shown in FIG. 10C. Each conductive path additionally includes a fixed portion 141 secured within the substrate 112.

Referring again to FIG. 10C, the semiconductor substrate 112 is processed to the structure illustrated in FIG. 10B. Then, by using a selective etch designed to preferentially attack the material of the substrate 112, free, cantilevered portions 142, are exposed, resulting in the structure illustrated in FIG. 10C. A suitable etchant is 6% tetramethyl ammonium hydroxide (TMAH) in propylene glycol when the semiconductor substrate 112 is made from single crystal silicon. TMAH is a suitable anisotropic etchant because it will not substantially etch metal, thus it will not etch conductive paths 135, 136. Also, TMAH does not form an oxide. Portions of the substrate 112 not to be etched, such as second surface 116, may be protectively masked.

Spring-like deflecting contacts 134 including the free, cantilevered portions 142 protruding from semiconductor substrate 112 may be formed at any desired angle using the sloped vias 125, 126 positioned, or sloped, in the semiconductor substrate 112 at the desired angle. If desired, to facilitate soldering the spring contacts to corresponding bond or terminal pads on another electrical device, the tips of each of the free, cantilevered portions 142 may be coated with a solder wettable material such as, for example, gold, silver, copper, nickel, alloys thereof, or any other metal or alloy that will allow typical lead or tin solders to wet it.

The spring-like deflecting contacts 134 may be used in a contact card or an interposer to provide electrical communication between two electrical devices. The fixed portion 141 of the spring-like deflecting contacts 134 may provide communication with a first electrical device. The free, cantilevered portion 142 of the spring-like deflecting contacts 134 may be soldered to the terminal or bond pads of another electrical device, as in flip-chip applications. If the spring-like deflecting contacts 134 are not soldered to the terminal or bond pads, such as when employing a contact card or probe card for testing another electrical device, the angle θ that the free, cantilevered portion 142 protrudes from the semiconductor substrate 112 results in the spring-like deflecting contacts 134 sliding on the terminal or bond pads of the electrical device to be tested after making contact therewith due to their resiliency. The angle θ that the free, cantilevered portion 142 protrudes may be used to cause the spring-like deflecting contacts 134 to slide on the terminal or bond pads and scrub off an oxide layer, which forms on some bond pads (i.e., aluminum bond pads) for better electrical contact.

Figure 11A:
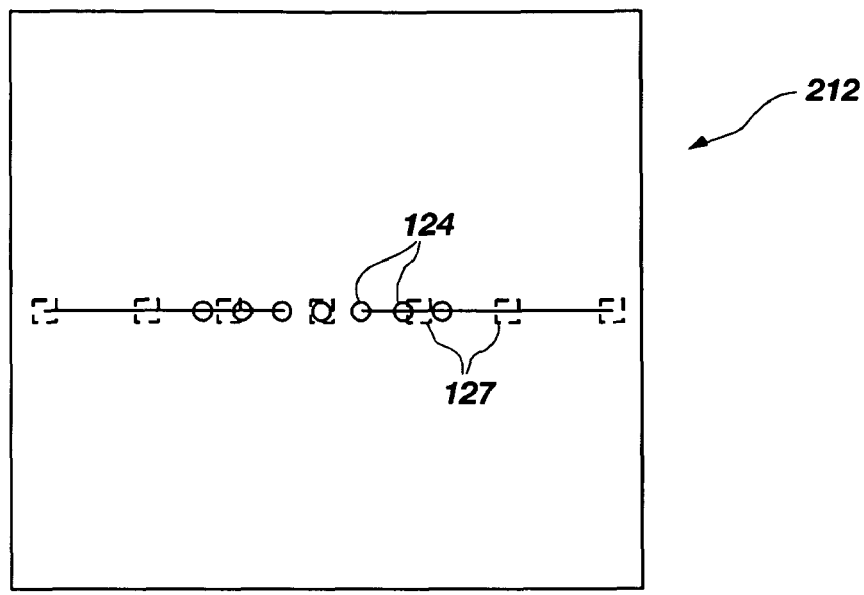
FIG. 11A is a schematic representation of an overhead view of a substrate having sloped vias of the present invention.
Figure 11B:
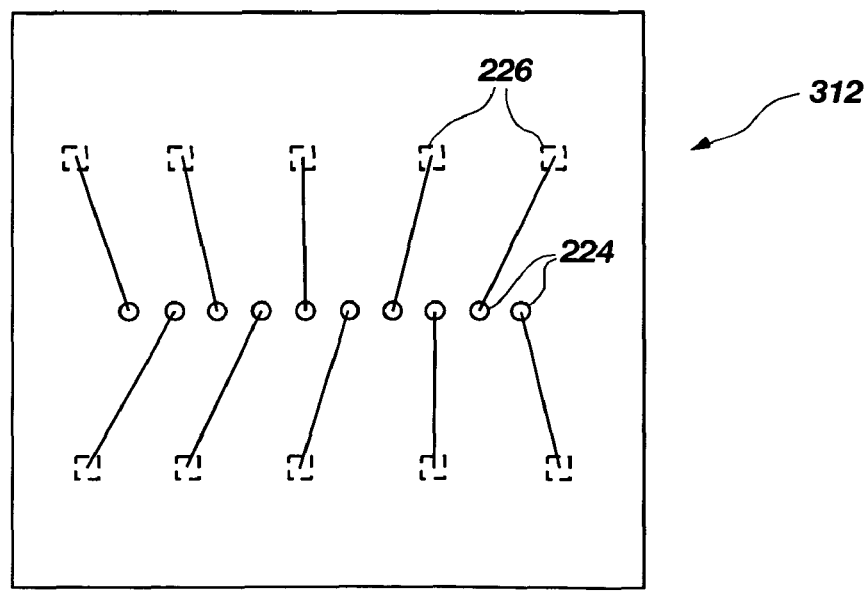
FIG. 11B is a schematic representation of an overhead view of another substrate having sloped vias of the present invention.
Figure 12:
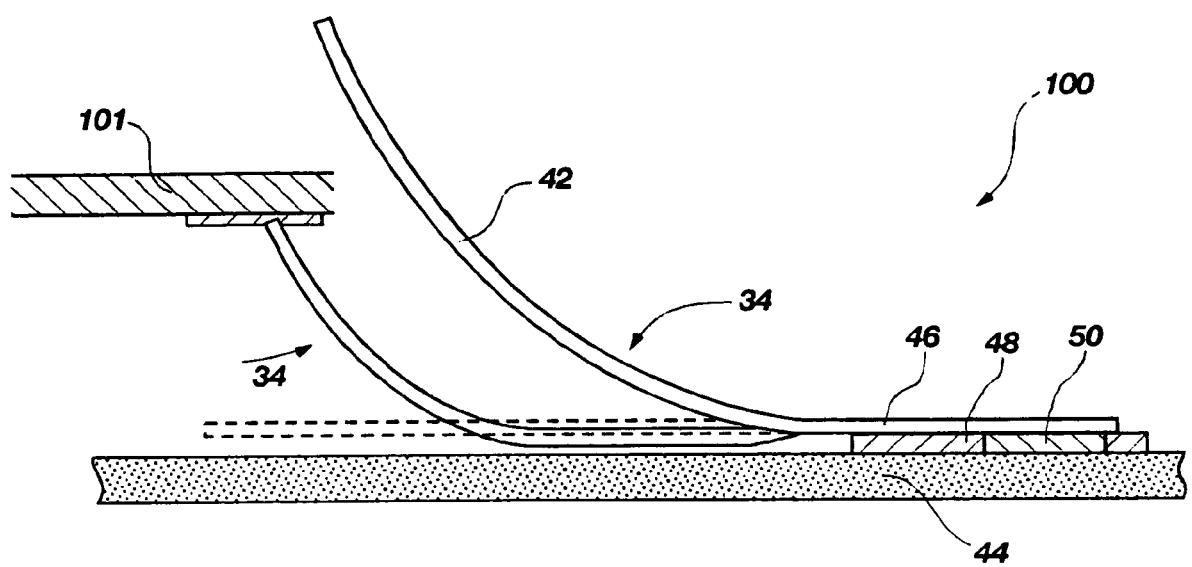
FIG. 12 illustrates a prior art photolithographically patterned spring contact.

A plurality of sloped vias may be located in the same plane, or may be located in a number of different planes. For example, FIG. 11A depicts an overhead view of a substrate 212 having a plurality of sloped via access points 124 located on a first surface thereof. The access points 124 are shown arranged in a linear pattern. Sloped via access points 127 located on a second, opposing surface of the substrate 212, shown as dashed squares for clarity, may also be arranged in a linear pattern having wider spacing. Alternatively, a plurality of sloped vias may be located in a number of different planes, and the access points distributed over a greater area, as shown in FIG. 11B. The plurality of sloped vias may form a fan pattern in the x and y direction through a substrate 312. For example, the access points 224 of the plurality of vias on the first surface of the substrate may be arranged in a linear pattern, and the access points 226 of the plurality of vias on the second, opposing surface of the substrate may be arranged in a two-dimensional array as shown. As will be appreciated by those of ordinary skill in the art, the access points located on the first surface of the substrate and the access points on the second surface of the substrate may be arranged in a variety of patterns. For example, the first surface access points may be arranged in an array, and the second, opposing surface access points may be arranged in another array having different spacing. In addition, it will be appreciated that a substrate having any number of sloped vias, and therefore any number of access points, is within the scope of the present invention.

As will be appreciated by those of ordinary skill in the art, the present invention enables electrical communication between laterally offset points in different planes without the use of an RDL. Vias of the present invention arranged in a fan-in or fan-out pattern allow redistribution of I/O terminals from a fine pitch to a larger pitch. Additionally, a spring-like deflecting contact may be formed at any desired angle with respect to the surface of a substrate.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A semiconductor component, comprising:
   a substrate comprising:
      a first surface; and
      a second surface opposing the first surface;
   at least one via in the substrate having a substantially smooth and continuous inner wall and having an access point in the first surface laterally offset from an access point in the second surface, the access point in the first surface and the access point in the second surface being in direct communication; and
   at least another via in the substrate having a substantially smooth and continuous inner wall and having another access point in the first surface laterally offset from another access point in the second surface, wherein the another access point in the first surface and the another access point in the second surface of the at least another via are laterally offset a different distance than the access point in the first surface and the access point in the second surface of the at least one via.

2. The semiconductor component of claim 1, further comprising a conductive material within the at least one via.

3. The semiconductor component of claim 2, wherein the conductive material within the at least one via comprises a metal.

4. The semiconductor component of claim 3, wherein the metal comprises one of copper, aluminum, nickel, gold and silver.

5. The semiconductor component of claim 1, further comprising a conductive element extending across the at least one via in electrical communication with another conductive structure exposed on the first surface of the substrate.

6. The semiconductor component of claim 5, wherein the another conductive structure comprises a redistribution layer trace.

7. The semiconductor component of claim 1, wherein the at least one via is lined with a dielectric material.

8. The semiconductor component of claim 1, wherein the substrate comprises one of a wafer, a bulk semiconductor substrate, and a singulated die.

9. The semiconductor component of claim 1, wherein the substrate further comprises at least two substrates in stacked formation.

10. The semiconductor component of claim 1, wherein a longitudinal axis of the at least one via is angled with respect to a plane of the first surface.

11. The semiconductor component of claim 1, wherein the at least one via comprises:
   a first opening having a longitudinal axis angled with respect to a plane of the first surface; and
   a second opening having a longitudinal axis perpendicular with respect to a plane of the first surface.

12. The semiconductor component of claim 1, further comprising a plurality of sloped vias arranged in a fan pattern.

13. The semiconductor component of claim 1, the access point in the first surface being laterally offset from the access point in the second surface in at least two dimensions.

14. A stacked semiconductor device assembly, comprising:
   a first semiconductor die having an active surface including at least one bond pad and at least another bond pad;
   a second semiconductor die having an active surface including at least one bond pad and at least another bond pad, the second semiconductor die being positioned over the first semiconductor die;

at least one sloped via having a substantially smooth and continuous inner wall, the at least one sloped via in electrical communication with the at least one bond pad of the first semiconductor die and the at least one bond pad of the second semiconductor die, the at least one sloped via positioned at an acute angle with respect to the active surface of the first semiconductor die; and at least another sloped via having a substantially smooth and continuous inner wall, the at least another sloped via in electrical communication with the at least another bond pad of the first semiconductor die and the at least another bond pad of the second semiconductor die, the at least another sloped via positioned at another acute angle with respect to the active surface of the first semiconductor die, wherein the another acute angle of the at least another sloped via with respect to the active surface of the first semiconductor die is different than the acute angle of the at least one sloped via with respect to the active surface of the first semiconductor die.

15. The stacked semiconductor device assembly of claim 14, further comprising a conductive material within the at least one sloped via.

16. The stacked semiconductor device assembly of claim 14, wherein the conductive material within the at least one sloped via comprises a metal.

17. The stacked semiconductor device assembly of claim 16, wherein the metal comprises one of copper, aluminum, nickel, gold and silver.

18. The stacked semiconductor device assembly of claim 14, further comprising a conductive element extending across the at least one sloped via in electrical communication with another conductive structure exposed on the active surface of the first semiconductor die.

19. The stacked semiconductor device assembly of claim 18, wherein the another conductive structure comprises a redistribution layer trace.

20. The stacked semiconductor device assembly of claim 14, wherein the at least one sloped via is lined with a dielectric material.

21. The stacked semiconductor device assembly of claim 14, further comprising a third semiconductor die positioned between the first semiconductor die and the second semiconductor die.

22. The stacked semiconductor device assembly of claim 21, wherein the at least one sloped via extends through the second semiconductor die and the third semiconductor die.

23. The stacked semiconductor device assembly of claim 14, wherein the at least one sloped via is positioned at an acute angle in at least two dimensions with respect to the active surface of the first semiconductor device.

24. A semiconductor component, comprising:
a substrate having a first surface; and
a plurality of vias in the substrate, at least one via of the plurality of vias having a longitudinal axis at an acute angle with respect to a plane of the first surface and at least another via of the plurality of vias having another longitudinal axis at another acute angle with respect to the plane of the first surface, wherein the another acute angle of the another longitudinal axis of the at least another via of the plurality of vias is different than the acute angle of the longitudinal axis of the at least one via of the plurality of vias.

25. The semiconductor component of claim 24, wherein the plurality of vias defines a fan pattern in the substrate.

26. The semiconductor component of claim 24, wherein the substrate further comprises a first substrate layer and a second substrate layer.

27. The semiconductor component of claim 26, wherein at least one via of the plurality of vias includes a first opening in the first substrate layer and a second opening in the second substrate layer.

28. A semiconductor component, comprising:
a substrate comprising:
 a first surface; and
 a second surface opposing the first surface; and
at least one sloped via filled with conductive material, the conductive material defining a conductive path including a free, cantilevered portion extending from the first surface of the substrate at an acute angle with respect to the first surface, and another portion extending within the substrate at the acute angle with respect to the first surface, the free, cantilevered portion and the another portion of the conductive path having a common longitudinal axis.

29. An electrical device comprising:
a substrate having a plurality of spring-like contacts, at least one of the plurality of spring-like contacts in electrical communication with circuitry on or within the substrate, each of the plurality of spring-like contacts comprising:
 at least one conductive path secured to the substrate, the at least one conductive path having a free, cantilevered portion extending from a surface of the substrate at an acute angle with respect to the surface, and another portion extending within the substrate at the acute angle with respect to the surface, the free, cantilevered portion and the another portion of the conductive path having a common longitudinal axis.

30. A spring-like contact structure comprising:
a substrate having at least one conductive path secured therein, the at least one conductive path having a free, cantilevered portion extending from a surface of the substrate at an acute angle with respect to the surface, and another portion secured within the substrate, the free, cantilevered portion and the another portion of the conductive path having a common longitudinal axis.

* * * * *